(12) United States Patent
Reindl et al.

(10) Patent No.: US 7,497,475 B1
(45) Date of Patent: Mar. 3, 2009

(54) MULTI-TEXTURED REFLECTIVE DISPLAY

(75) Inventors: Michael G. Reindl, West Bend, WI (US); Michael A. Terlizzi, Grafton, WI (US); Joel Scott Scarbrough, Burlington, WI (US)

(73) Assignee: Serigraph, Inc., West Bend, WI (US)

( * ) Notice: Subject to any disclaimer, the term of this patent is extended or adjusted under 35 U.S.C. 154(b) by 463 days.

(21) Appl. No.: 11/151,124

(22) Filed: Jun. 13, 2005

Related U.S. Application Data

(63) Continuation-in-part of application No. 10/388,782, filed on Mar. 14, 2003, now Pat. No. 7,048,307.

(51) Int. Cl.
*B42D 15/00* (2006.01)
(52) U.S. Cl. ...................................... 283/91
(58) Field of Classification Search .................. 283/74, 283/75, 77, 85, 87, 91, 94, 107–110; 428/40.1, 428/40.9, 41.7, 42.1, 42.3
See application file for complete search history.

(56) References Cited

U.S. PATENT DOCUMENTS

| | | | |
|---|---|---|---|
| 3,096,596 A * | 7/1963 | Magnuson et al. ............ 40/615 |
| 3,806,397 A * | 4/1974 | Kukoff ....................... 428/41.1 |
| 4,913,504 A | 4/1990 | Gallagher |
| 4,933,218 A | 6/1990 | Longobardi |
| 5,082,703 A | 1/1992 | Longobardi |
| 5,106,126 A | 4/1992 | Longobardi et al. |
| 5,270,101 A | 12/1993 | Helicher |
| 5,456,967 A | 10/1995 | Nezu |
| 5,492,370 A | 2/1996 | Chatwin et al. |
| 5,585,153 A * | 12/1996 | Kamen et al. .............. 428/35.7 |
| 5,741,578 A | 4/1998 | Sax |
| 5,742,411 A | 4/1998 | Walters |
| 5,744,219 A | 4/1998 | Tahara |
| 5,762,379 A | 6/1998 | Salmon et al. |
| 5,851,032 A | 12/1998 | Green |
| 6,042,888 A | 3/2000 | Sismanis et al. |
| 6,113,149 A * | 9/2000 | Dukatz ....................... 283/91 |
| 6,132,822 A | 10/2000 | Overcash et al. |
| 6,145,565 A | 11/2000 | Fromson et al. |
| 6,170,881 B1 | 1/2001 | Salmon et al. |
| 6,180,228 B1 | 1/2001 | Mueller et al. |
| 6,181,446 B1 | 1/2001 | Cox et al. |
| 6,187,389 B1 | 2/2001 | Overcash et al. |

FOREIGN PATENT DOCUMENTS

WO    WO 98/33660    8/1998

* cited by examiner

*Primary Examiner*—Dana Ross
*Assistant Examiner*—Pradeep C Battula
(74) *Attorney, Agent, or Firm*—Andrus, Sceales, Starke & Sawall, LLP

(57) ABSTRACT

A printed substrate includes multi-textured patterns and reflective layers thereover. An economical manufacturing method is provided. A printed circuit board is further provided.

8 Claims, 5 Drawing Sheets

US 7,497,475 B1

MULTI-TEXTURED REFLECTIVE DISPLAY

CROSS-REFERENCE TO RELATED APPLICATION

This application is a Continuation-In-Part of U.S. patent application Ser. No. 10/388,782, filed Mar. 14, 2003 now U.S. Pat. No. 7,048,307.

BACKGROUND AND SUMMARY

The invention of the noted parent application relates to reflective displays, including image displays, and methods of manufacture, for example trading cards, greeting cards, signs, posters, labels, decals, book covers, decorative panels, packaging, name plates, and other displays including designs incorporating a selective area of metallic appearance resembling liquid metal, and other reflective displays.

The parent invention arose during continuing development efforts relating to image displays, including printed articles, including subject matter related to U.S. Pat. Nos. 6,170,881 and 5,762,379 owned by the assignee of the present invention, and incorporated herein by reference.

Highly reflective materials have long been known to attract the human eye. Metallic inks, hot stamping foils, vacuum metallized substrates, metallic flakes incorporated into inks and coatings have all been used to impart such eye catching and aesthetically pleasing effects to decorated articles. Each of these techniques has advantages and disadvantages. The major disadvantage has been the inability to apply a metallic or holographic effect selectively and impart texture and/or thickness if desired to the metallic area. The ability to selectively apply metallics has been limited to printing metallic inks, selectively blocking out a metallic substrate (only allowing the desired areas of the metallic substrate to show through), or to hot stamp. Metallic inks do not have the reflective brilliance of vacuum metallized foils and substrates. Hot stamping requires the use of expensive equipment and expensive hot stamping dyes. The above noted incorporated U.S. Pat. No. 6,170,881 provides one solution. The parent invention provides a further improvement, including enhanced economy of manufacture.

The present invention arose during continuing development efforts related to the subject matter of the above-noted parent application.

BRIEF DESCRIPTION OF THE DRAWINGS

Parent Application

Present Application

Figure 1:
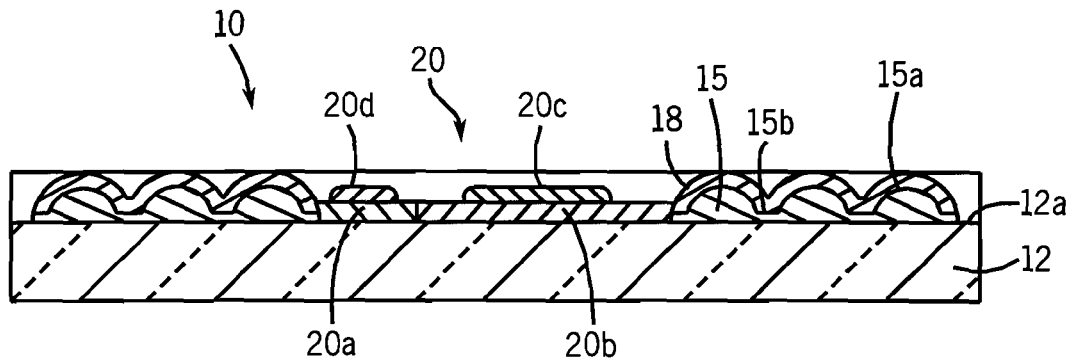
FIG. 1 is a cross-sectional view illustrating a display in accordance with the parent invention.
Figure 10:
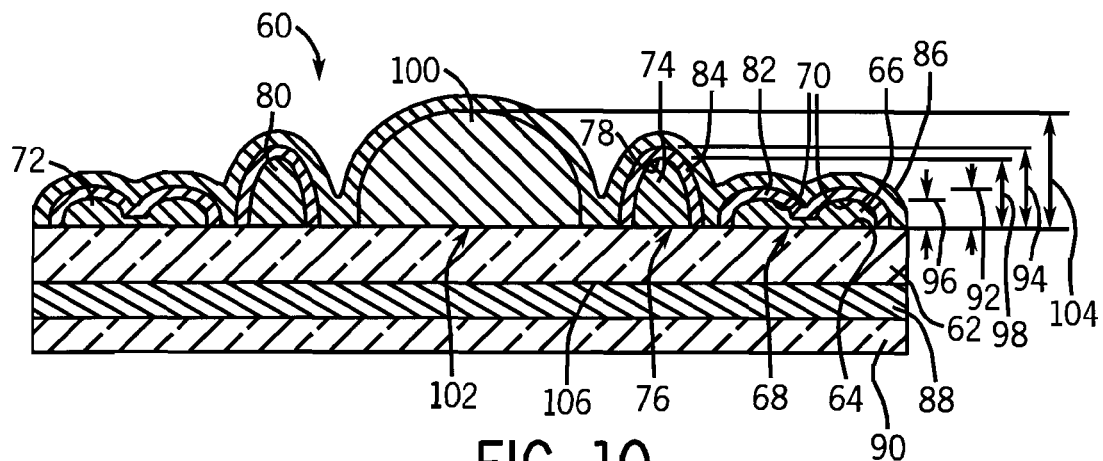
Figure 11:
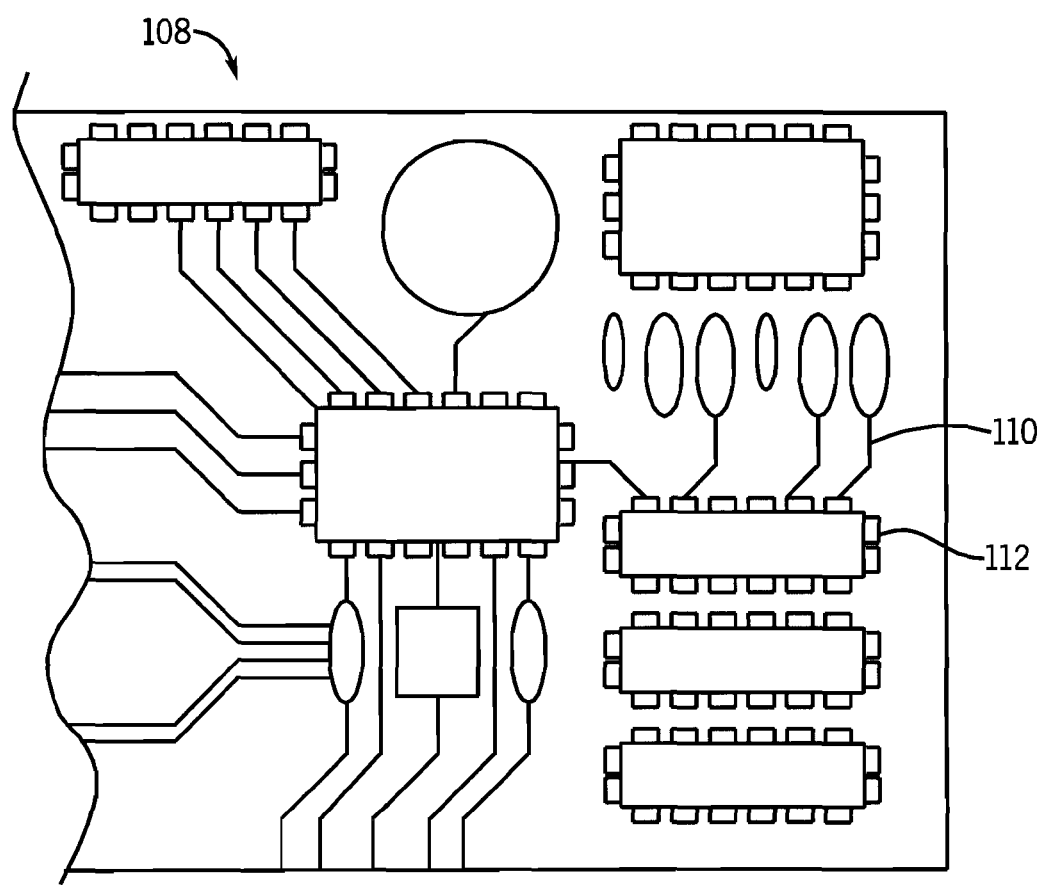

FIG. 10 is a view like FIG. 1 and shows the present invention.
FIG. 11 is a top elevation view of a further embodiment.

DETAILED DESCRIPTION

Parent Application

As illustrated in FIG. 1, a display is provided by printed article 10 having a visual display formed thereon which is manufactured in accordance with a method of the parent invention. The article 10 includes a base sheet 12 which can be opaque or transparent, and flexible or rigid.

An opaque sheet 12 can be formed of paper, cardboard, metal, or any other suitable material. An opaque sheet is appropriate for producing trading cards, greeting cards, signs, posters, labels, book covers, decorative panels, name plates, and the like. Alternatively, the sheet 12 can be replaced by an object having a flat surface, such as the side of a building.

A transparent sheet 12 can be formed of plastic, glass, or any other suitable material. A transparent sheet is appropriate for producing details and the like, and can also be used for producing other items with a rear surface reflective layer and protective cover, in addition to a front surface reflective layer and protective cover, to be described.

An opaque sheet 12 is preferably formed from board or paper stock that is between 8.0 and 30.0 mils thick, although thicker or thinner stock may be used where the application requires. In applications such as trading cards, stock that is approximately 10.0 mils thick is typically used. The board or paper stock should be treated with a moisture stable coating that will prevent ink from being absorbed by the stock.

For applications where greater flexibility is required, such as decals, the base may be relatively thin or composed of a flexible plastic material. Conversely, thicker stock and rigid plastic may be used in applications where rigidity is required, such as free standing displays.

The base sheet 12 has a front surface 12a which is typically flat, although the parent invention is not so limited. An adhesive pattern 15 is formed on surface 12a. For those applications where height, depth and dimension is desired, pattern 15 is textured and has a varying thickness with a plurality of thicker portions providing protrusions 15a and a plurality of thinner portions providing recesses 15b. The protrusions and recesses are in the form of lines, circular bumps, or any other suitable design. The thickness (height) of protrusions 15a is approximately 1.0 to 1.5 mils to ensure visibility, and the thickness of recesses 15b is approximately 0.2 to 0.5 mils, though the thickness may be made larger or smaller to suite particular applications. The adhesive pattern layer 15 is formed over base 12 using screen printing, offset printing, or any other suitable process, including other types of printing or other methods such as hand painting. An appropriate adhesive is Rage 800 Clear Ink which is commercially available from Nazdar of Chicago, Ill.

A reflective layer 18 is formed on adhesive 15, such that reflective layer 18 is adhered to the pattern thereof. Reflective layer 18 is preferably formed on monochrome (e.g. solid chrome) or holographic roll leaf. The roll leaf foil is typically secured to a carrier, such as a polyester film, with a release layer therebetween. Adhesive pattern 15 is preferably a heat activated adhesive. Pressure (as well as heat, if adhesive 15 is heat activated) is applied to bond the roll leaf to the pattern 15. The carrier is then removed. The roll leaf used to form reflective layer 18 is different from conventional roll leaf in that it does not have an adhesive on its exposed surface. Instead, the adhesive is provided by pattern 15. Although the carrier with the roll leaf thereon is provided as a continuous sheet, the reflective foil layer thereon is transferred from the carrier to the pattern 15 only where the adhesive is present, to form the reflective layer 18. Roll leaf in areas in which the adhesive is not present remains attached to the carrier. A suitable monochrome roll leaf material is MEZ 5900 Chrome, which is commercially available from Astor Universal of Lenexa, Kans., and is applied using any conventional laminating technique which is available in the art for applying roll leaf. A suitable reflective holographic roll leaf is SEZ 5995 Chrome Rainbow Holographic, which is also commercially available from Astor Universal. Gold reflective and holographic roll leaf, as well as other types and colors of roll leaf, are also commercially available and are suitable for practicing the parent invention. Although roll leaf is the preferred material for forming the reflective layer 18, the parent invention is not so limited, and any other suitable material can be used to form the reflective layer 18. In some instances, some of the release coat will remain on the exposed surface of the roll leaf. As such, a primer (not shown) can be applied to the roll leaf to ensure that a subsequently applied ink image will stick to it. The primer may be water-based, UV curable, or conventional, and may be applied by lithography, silk-screening, or flexography. As a result, the surface of the reflective layer 18 follows the surface of pattern 15, and if the latter is textured, the portions of the reflective layer 18 overlying the protrusions 15a are raised above the neighboring areas 15b of the pattern 15. This produces an embossed effect which simulates a three-dimensional image.

Further illustrated in FIG. 1 are the results of performing a step of forming an ink image 20 on the surface 12a in an area not occupied by pattern 15. The image 20 can include opaque ink, at least partially transparent or translucent ink, or any combination thereof. As illustrated, the ink image 20 includes an area 20a formed of at least partially transparent or translucent ink, and an area 20b formed of opaque ink on the surface 12a. Typically, the image 20 will be formed using a conventional four-color printing process, using inks of three primary colors in combination with black ink. Suitable printing processes include lithography, silk-screening, and gravure. The image 20 can further include an area 20c of at least partially transparent or translucent ink formed on the opaque area 20b and/or an area 20d of opaque ink formed on the transparent area 20a. The portion of the transparent ink area 20a underlying the opaque ink area 20d is not visible to the viewer, but may be included to simplify the printing of the entire image 20. The opaque area 20d can be white to enhance the simulated depth effect. It is further within the scope of the parent invention to form transparent ink images on top of other transparent ink images, and opaque images on top of other opaque images, if doing so simplifies the printing process. The opaque ink areas 20b and 20d present a conventional flat, two-dimensional appearance to the viewer. The transparent area 20c may be tinted with a color which is different from the underlying opaque area 20b, such that the colors of the areas 20c and 20b combine to produce a third color.

The base sheet 12 can be opaque, with the surface 12a being white or of any other suitable color. Light passing through the portion of the transparent ink area 20a which is not covered by the area 20d will be reflected back to the viewer, and the color of this portion of the area 20a will be a combination of the color of the tinting of the area 20a and the color of the surface 12a. In this arrangement, the transparent areas of the image 20 produce a different visual effect from the opaque areas of the image 20.

An opaque base sheet 12 can be formed of card stock having a white reflective front surface 12a. In this case, a white shiny image area can be provided by the surface 12a itself without the necessity of printing the ink image 20 in this area. In an exemplary case of an image having a large white background, substantial economy can be realized by not having to print ink in the background area.

In the arrangement of FIG. 1, it is within the scope of the parent invention to form pattern 15 and reflective layer 18 first, and then form the ink image 20. Alternatively, the ink image can be formed first, and then the pattern 15 and reflective layer 18.

Figure 2:
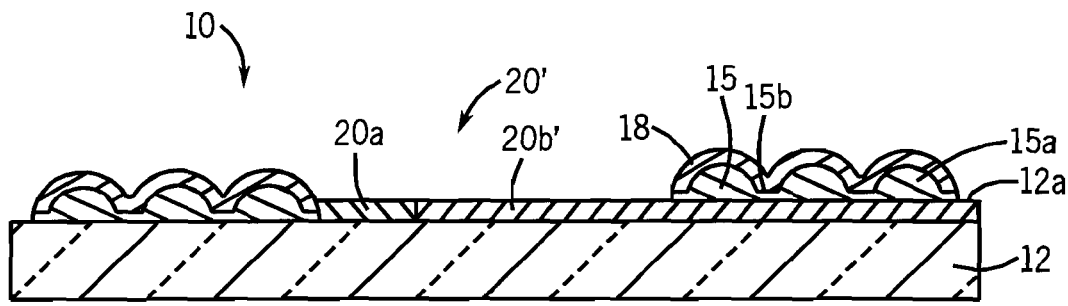
FIG. 2 is like FIG. 1 and shows a further embodiment.

FIG. 2 illustrates a variation of the method of FIG. 1, in which an ink image 20' is formed first, and the pattern 15 and reflective layer 18 are formed subsequently. Like elements are designated by the same reference numerals used in FIG. 1, where corresponding but modified elements are designated by the same reference numerals primed. In this case, the overall processing may be facilitated by forming the ink image 20' over all or part of the surface 12a, and then forming the pattern 15 and reflective layer 18 over all or part of the image 20'. As shown, a portion of the opaque layer 20b' extends under the right portion of the pattern 15. Thus, pattern 15 is formed in a first area, the ink image 20' is formed in a second area, and the pattern 15 and image 20' overlap in a third area which is co-extensive with the first area.

Figure 3:
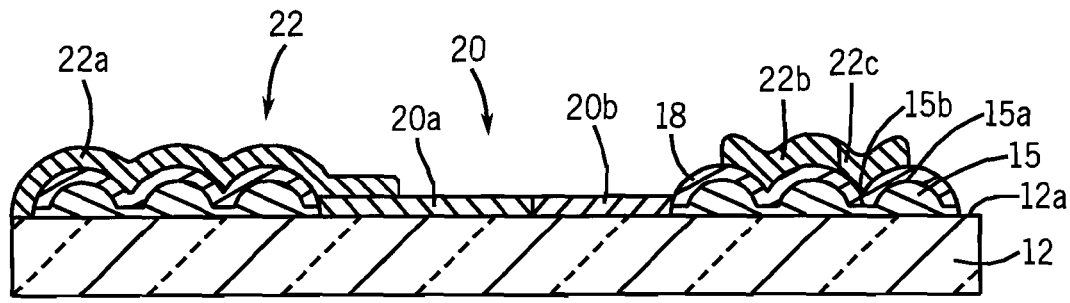
FIG. 3 is like FIG. 1 and shows a further embodiment.

The method of the parent invention can further include forming an additional ink image 22 over part or all of the roll leaf foil reflective layer 18 as illustrated in FIG. 3. The image 22 as shown includes a transparent area 22a which is formed over the left portion of the reflective layer 18 and the left portion of the ink image 20, a transparent area 22b which is formed over part of the right portion of the reflective layer 18, and an opaque area 22c which is formed over the right portion of the reflective layer 18. The portion of the reflective layer 18 underlying the opaque area 22c will not be visible to a viewer. It is further within the scope of the parent invention to form the additional image 22 as including multiple layers as illustrated in FIG. 2, and to form transparent ink areas over opaque ink areas.

Figure 4:
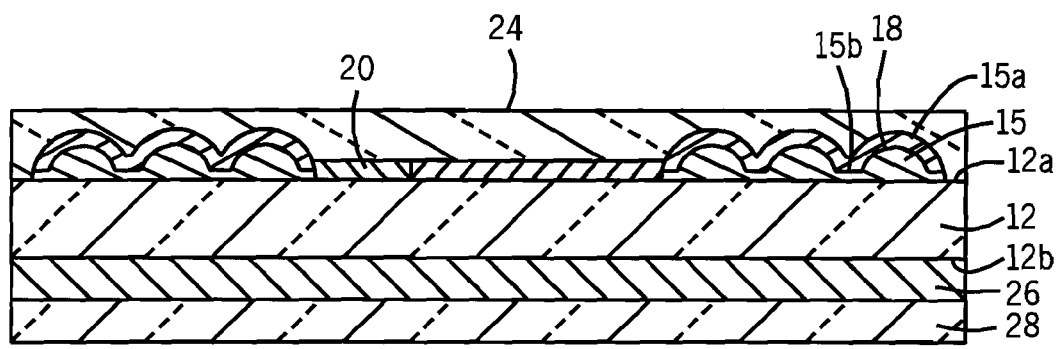
FIG. 4 is like FIG. 1 and shows a further embodiment.

FIG. 4 further illustrates a protective transparent layer 24 which is formed over the reflective layer 18, image 20, and any exposed portions of the surface 12a. The layer 24 as illustrated is sufficiently thick that the method can further comprise planarizing the layer 24 in any known manner so that the exposed surface thereof is flat.

Figure 5:
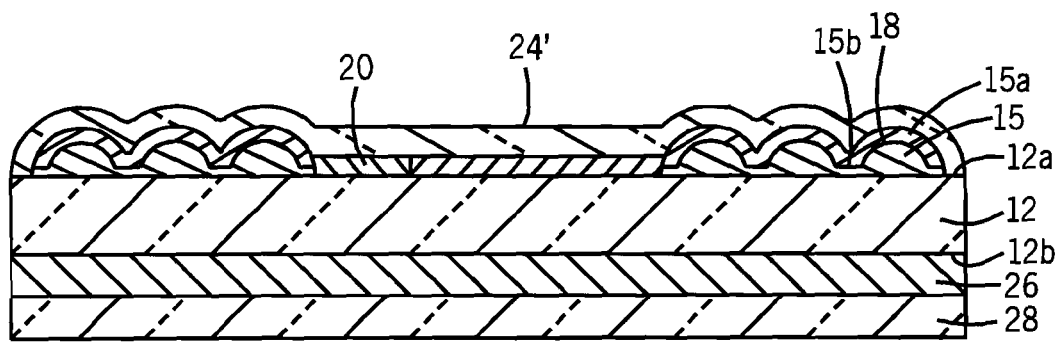
FIG. 5 is like FIG. 1 and shows a further embodiment.

FIG. 5 illustrates an alternative transparent layer 24' which is thinner than the layer 24, and does not have a planar exposed surface. Instead, the exposed surface follows the underlying pattern 15 such that portions of the surface which overlie the protrusions 15a (in the case of a textured adhesive pattern 15) are raised to enhance the embossing effect.

The transparent layer 24 or 24' can be formed of any suitable material. Exemplary materials include transparent ink (either water-based, UV curable, or conventional solvent evaporative), catalysts and resin systems which produce a hard finish, and polyester, polyethylene, or polystyrene sheets. Transparent ink and catalyst and resin systems may be applied with a coater, by screen printing, spray painting, or using any other commercially available method, while the polyester sheet may be secured with a clear adhesive. The thickness of transparent layer 24 or 24' may be varied in order to achieve the desired surface texture and appearance. If a relatively thin (approximately 1.0 to 2.0 mils) transparent layer 24 is employed, the top surface of the finished product will have a texture that corresponds to that of the textured pattern 15 as illustrated in FIG. 5. A thicker (approximately 10.0 mils) transparent layer 24 gives the finished product the appearance of depth as illustrated in FIG. 4. If the layer 24 is sufficiently thick, it will not require a subsequent planarization step to produce a flat exposed surface. The thickness of a transparent layer 24 or 24' applied with coaters may be varied by varying the number of coating layers applied. The thickness of a polyester sheet transparent layer will vary with the thickness of the sheet and the clear adhesive (either heat activated or pressure sensitive) which secures the sheet to the pattern 15 and image 20. For example, the adhesive layer (not shown) may be as thin as 1.2 mils and the polyester sheet may be as thin as 0.25 mils, for a combined thickness of approximately 1.5 mils. Thicknesses of approximately 10.0 mils may be achieved with a 2.0 mil sheet and 8.0 mils of adhesive, with a 7.0 mil sheet and 3.0 mils of adhesive, and with all combinations therebetween.

FIGS. 4 and 5 illustrate a layer 26 which is formed on a rear surface 12b of the base sheet 12, and a protective transparent layer 28 which is formed over the layer 26. It will be noted that the layers 24, 24', 26, and/or 28 can be applied to the embodiments above or variations thereof. If sheet 12 is transparent, the layer 26 can be an opaque layer of any color or pattern, or a shiny reflective or holographic layer. Where the layer 26 is opaque, it can provide a rear side ink image which is visible by viewing the sheet 12 from the front surface 12a or from the rear surface 12b, or from both surfaces. The layer 26 is visible through any transparent areas of the image 20. If the layer 26 is opaque, the color of the transparent areas of the image 20 will be a combination of any tinting of the transparent areas and the color of the layer 26. If the layer 26 is reflective, the color of the transparent areas will be the color of the tinting, with a shiny metallic appearance to enhance the simulated depth effect. It is further within the scope of the parent invention to omit the reflective layer 26 in one or more areas to produce a clear or color tinted appearance which can be back lit.

A preferred application of a visual display including an opaque base sheet 12 is a trading card, in which case the base sheet 12 will be made of cardboard or other suitable board stock. The front surface 12a of the sheet 12 will be white, or be of any other suitable color or pattern of colors. The layer 26 formed on the rear surface 12b will be a rear side ink image which is typically formed by printing. A suitable process for forming the rear side ink image is four-color lithography. In this manner, images can be formed on both sides of the sheet 12 without resorting to lamination.

Figure 6:
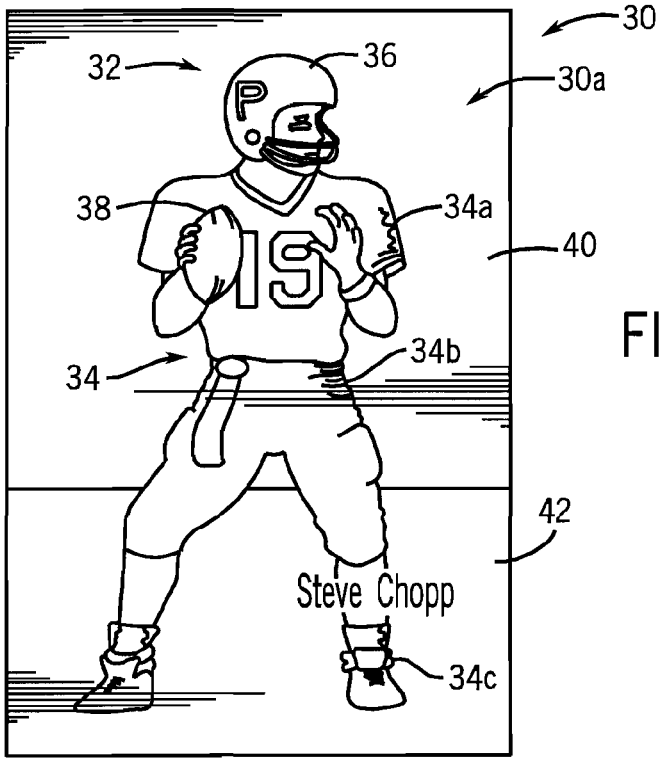
FIG. 6 is a front view of a trading card having an image display in accordance with the parent invention.
Figure 7:
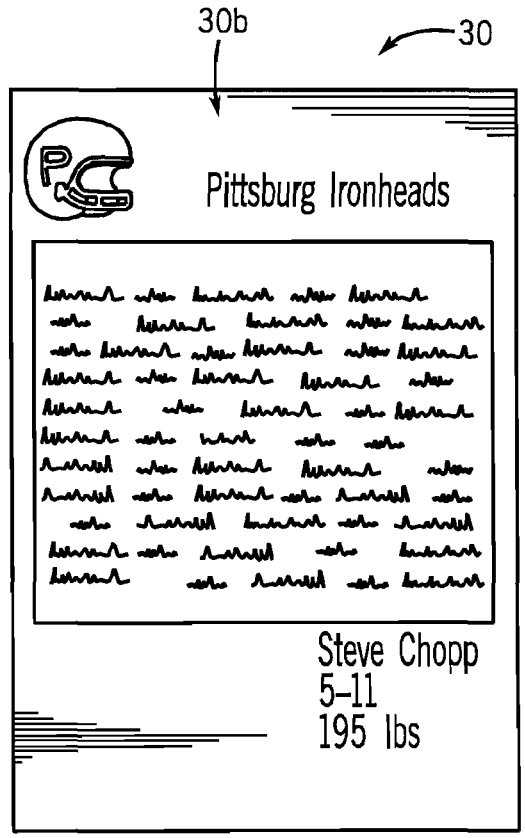
FIG. 7 is a rear view of the trading card of FIG. 6.
Figure 8:
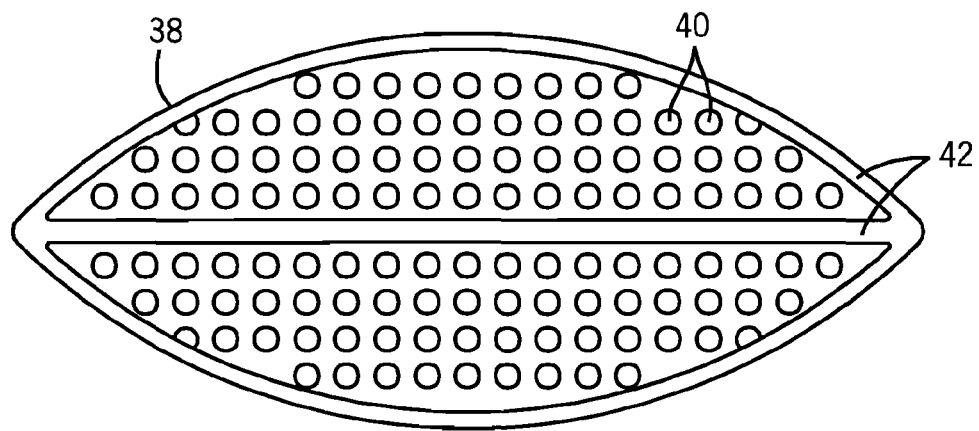
FIG. 8 is an enlarged view of a portion of FIG. 6.

An exemplary football trading card 30 is illustrated in FIGS. 6 to 8. FIG. 6 illustrates a front side 30a of the card 30 which has a textured image and an ink image formed thereon in the manner described above with reference to FIG. 1. FIG. 7 illustrates the rear side 30b of the card 30 which has an ink image printed thereon as described above with reference to FIGS. 4 and 5. The front side 30a of the card 30 includes a picture of a player 32 named Steve Chopp, whereas Steve's biographical data and statistics are printed on the rear side 30b of the card 30. As viewed in FIG. 6, the player 32 is wearing a uniform 34 and a helmet 36 and holding a football 38. Further visible is sky 40 and grass 42. The front side 30a of the card 30 is formed by printing a textured pattern corresponding to the football 38 and other areas which are to be accentuated by simulated embossing. As illustrated in FIG. 8, the textured pattern of the football 38 typically comprises a plurality of distributed circular protrusions or bumps 40, and continuous protrusions 42 which depict the seams of the football 38. Continuous linear protrusions 15a of adhesive pattern 15 are also formed to accentuate items such as portions 34a and 34b of the uniform 34, and shoelaces 34c as viewed in FIG. 6. After the textured pattern including the circular bump protrusions 40 and continuous protrusions 42, 34a to 34c have been formed on front side 30a of the card 30, roll leaf is applied to the textured areas as described above. Then, an ink image is formed on the front side 30a of the card 30, except for background and other areas which are to be constituted by the white or other colored surface of the front side 30a itself. For example, all areas except for the helmet 36 and football 38 can be formed of opaque ink, whereas transparent or translucent ink will be applied over the helmet 36 and football 38. Thus, the helmet 36 and football 38 will have a shiny appearance to simulate depth, whereas the football 38 and other textured areas will appear embossed to further enhance the simulated depth effect. It is further within the scope of the parent invention to apply roll leaf to areas of the image which are not textured to provide flat, reflective image areas. Reflective and/or opaque ink can be selectively applied to portions of these areas as described above. A protective transparent layer such as illustrated in FIG. 4 or 5 can be formed on the side 30a if desired. The players data is printed on the rear side 30b of the card 30 using a conventional lithographic or other suitable process in a separate operation. The rear side 30b can be printed before or after forming the front side 30a.

The parent invention provides a method for producing a printed or similarly produced article, which overcomes the drawbacks of the prior art, and enables a pseudo three-dimensional visual display comprising a textured pattern including monochrome or holographic roll leaf to be formed on a surface of a base sheet which can be opaque as well as transparent. The parent invention enables a two-sided article, such as a trading card, poster, decal, or sign, to be produced by printing an image on the side of the sheet opposite that which supports the pattern 15. This eliminates the need to laminate two separately printed articles to one another.

The parent invention provides an image display 10, 30 including a base 12 having a front surface 12a, an adhesive pattern 15 formed over a first area of front surface 12a, a reflective layer 18 formed over the adhesive pattern 15, and an image 20 formed over a second area of the front surface 12a which is at least partially not occupied by the reflective layer 18. Reflective layer 18 is preferably a reflective foil layer transferred from a roll leaf. Adhesive pattern 15 is preferably heat activated adhesive. The reflective foil layer is transferred only to pattern 15 over the noted first area where heat activated adhesive is applied. In one form, adhesive pattern 15 is a textured pattern, and the adhesive pattern and the textured pattern are the same, i.e. a single layer textured adhesive coating of varying thickness. The textured adhesive pattern of varying thickness has a plurality of thicker portions providing protrusions 15a, and a plurality of thinner portions providing recesses 15b, wherein the reflective layer 18 is formed over protrusions 15a and over recesses 15b. In a further embodiment, FIG. 2, the noted first and second areas overlap in the noted third area, and adhesive pattern 15 and reflective layer 18 are formed over image 20b' in such third area.

The parent invention provides a method for making an image display 10, 30 by providing a base 12 having a front surface 12a, forming an adhesive pattern 15 over a first area of the front surface 12a, forming a reflective layer 18 over the adhesive pattern 15, and forming an image 20 over a second area of the front surface 12a which is at least partially not common with the noted first area. Adhesive pattern 15 is preferably formed of heat activated adhesive, and reflective layer 18 is preferably formed by transferring a reflective foil layer from a roll leaf by heat and pressure. The reflective foil layer is transferred to pattern 15 only over the noted first area at the noted heat activated adhesive pattern. The embodiment of FIG. 2 involves overlapping the noted first and second areas at the noted third area, forming the image 20b' over the second area prior to forming adhesive pattern 15 and reflective layer 18, and then forming adhesive pattern 15 and reflective layer 18 over the image 20b' in the noted third area.

In one form of the method of the parent invention, the method involves applying as a single coating layer a textured heat activated adhesive pattern 15 of varying thickness on a first area of front surface 12a of base 12, eliminating a textured pattern layer separate from an adhesive layer.

Figure 9:
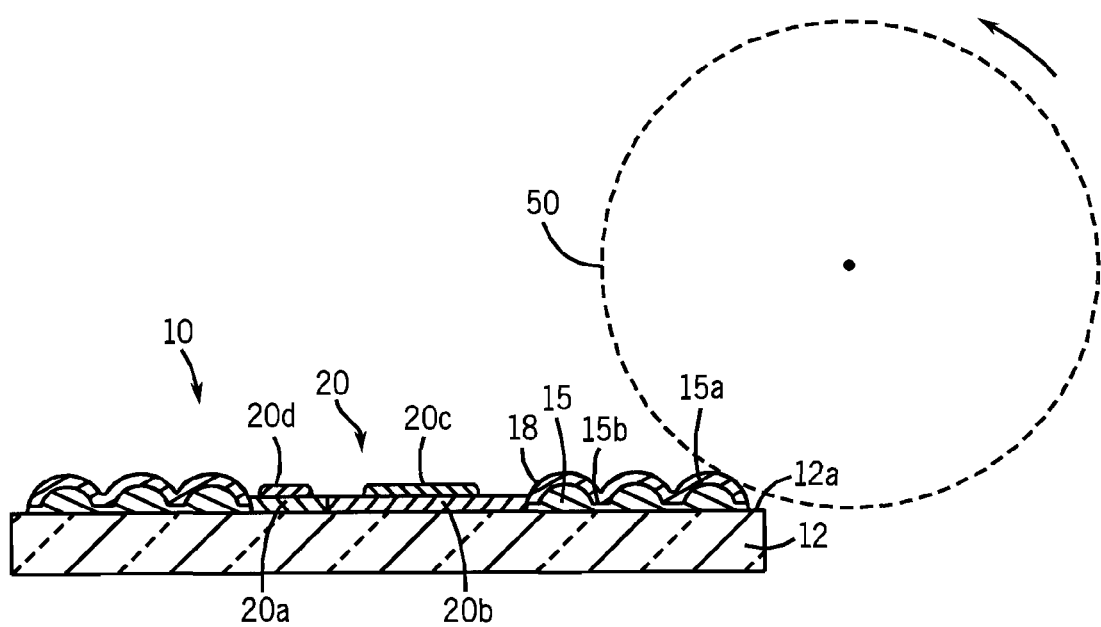
FIG. 9 is like FIG. 1 and illustrates a manufacturing step.

In a preferred manufacturing step, the noted reflective foil layer is transferred by using a heated resiliently conformable roller 50, FIG. 9, preferably a rubber roller. The heated resiliently conformable roller resiliently compresses at protrusions 15a and resiliently conforms to recesses 15b.

The parent invention provides a method for improving economy of manufacture of the image display by combining the texture pattern layer and the adhesive layer as a single coating formed with varying thickness in a pattern of a plurality of thicker portions providing protrusions 15a and a plurality of thinner portions providing recesses 15b.

In various embodiments, image 20 may optionally be deleted, whereby there is no image, or the image is provided by the reflective foil layer 18 and its pattern.

Present Application

FIG. 10 shows a printed substrate 60 including a base 62, which may be base sheet 12 of FIGS. 1-9 above. Base 62 has a front surface 64, and extends along a lateral plane, e.g. left-right in FIG. 10 and into the page in FIG. 10. A first textured pattern 66, which may be pattern 15 of FIGS. 1-9, is formed over a first area 68 of front surface 64 and has a plurality of first protrusions such as 70 extending normally therefrom, i.e. upwardly in FIG. 10. Pattern 66 may be an annulus and have another portion as shown at 72, or portions 66 and 72 may be separate non-connected portions. A second textured pattern 74 is formed over a second area 76 of front surface 64 and has one or more protrusions 78 extending normally therefrom. Pattern 74 may form an annulus or closed loop and have another portion at 80, or portions 74 and 80 may be separate non-connected portions. Pattern 74 may be provided by another pattern comparable to above described pattern layer 15. One or more reflective layers 82, 84 are formed over the noted first and second textured patterns 66 and 74, which reflective layers 82, 84 may be the above-noted reflective layer 18. An outer protective transparent layer or an image layer 86 may be provided, comparable to layer 22 noted above. Lower layers 88 and 90 may be provided, comparable to above-noted layers 26 and 28, respectively.

In one embodiment, first and second patterns 66 and 74 are adhesive patterns, as above-noted at layer 15, and the one or more reflective layers 82 and 84 comprise a reflective foil layer transferred from a roll leaf, as above described, only to the noted adhesive patterns and not to remaining areas of the substrate.

Reflective layer 82 over the one or more first protrusions 70 of first textured pattern 66 extends to a reflective height 92 normal to the noted lateral plane. Reflective layer 84 over the noted one or more second protrusions such as 78 of second textured pattern 74 extends to a reflective height 94 normal to the noted lateral plane. Reflective height 94 is greater than reflective height 92. The noted one or more first protrusions 70 of first textured pattern 66 extend to a pattern height 96 normal to the noted plane. The noted one more second protrusions such as 78 of second pattern 74 extend to a pattern height 98 normal to the noted lateral plane. Pattern height 98 is greater than pattern height 96. Height 92 is less than height 98.

In a further embodiment, an image 100, which may be provided by image layer 20 of FIGS. 1-9, is formed over a third area 102 of front surface 64 which is at least partially not occupied by the noted one or more reflective layers 82, 84. Image 100 extends to an image height 104 normal to the noted lateral plane. Image height 104 is greater than each of the noted first and second reflective heights 92 and 94. In one embodiment, image 100 is a reflective metallic ink in the center or middle of a doughnut formed by outer annular pattern layers 66, 74. In a further embodiment, base 62 is at least partially transparent and has a rear surface 106 opposite to front surface 64, and an additional reflective layer 88 is formed on rear surface 106. Further in such embodiment, an opaque background layer 90 is formed on reflective layer 88 on rear surface 106.

In a further embodiment, the invention provides a printed circuit board 108, FIG. 11, including the noted base 62 having an adhesive pattern 66 and/or 74 formed over an area 68 and/or 76 thereof, and an electrically conductive layer 82 and/or 84 over such adhesive pattern. The electrically conductive layer is a foil layer transferred from a roll leaf, as above. In one preferred form, the adhesive pattern is heat activated adhesive, as above, and the noted foil layer provides the electrically conductive layer transferred to the pattern only where heat activated adhesive is applied. Alternatively or additionally, the adhesive may be pressure activated. Conductive pattern 110 may have differing sections of varying height and/or width, for example for varying ohmic resistance, for providing differing resistance between components such as 112 on the printed circuit board.

It is recognized that various equivalents, alternatives and modifications are possible within the scope of the appended claims.

What is claimed is:

1. A printed substrate comprising:
a base having a front surface, and extending along a lateral plane;
a first textured pattern formed over a first area of said front surface and having one or more first protrusions extending normally therefrom;
a second textured pattern formed over a second area of said front surface and having one or more second protrusions extending normally therefrom;
one or more reflective layers over said first and second textured patterns,
wherein:
said one or more first protrusions of said first textured pattern extend to a first thickness to provide a first pattern height normal to said lateral plane;
said one or more second protrusions of said second pattern extend to a second thickness to provide a second pattern height normal to said lateral plane;
said second thickness is greater than said first thickness;
said second pattern height is greater than said first pattern height;
said one or more protrusions of said first textured pattern having a first face surface facing said base, and having a distally opposite second face surface facing away from said base;
said first thickness is the distance between said first and second face surfaces;
said one or more protrusions of said second textured pattern having a third face surface facing said base, and having a distally opposite fourth face surface facing away from said base;
said second thickness is the distance between said third and fourth face surfaces.

2. The printed substrate according to claim 1 comprising an image formed over a third area of said front surface which is at least partially not occupied by said one or more reflective layers, wherein said image extends to a third thickness to provide an image height normal to said lateral plane, and said third thickness is greater than said second thickness.

3. The printed substrate according to claim 2 wherein:

said one or more reflective layers over said first protrusions of said first textured pattern extend to a first reflective height normal to said lateral plane;

said one or more reflective layers over said second protrusions of said second textured pattern extend to a second reflective height normal to said lateral plane;

said image height is greater than each of said first and second reflective heights.

4. The printed substrate according to claim 1 wherein:

each of said first and second patterns are adhesive patterns;

said one or more reflective layers comprise a reflective foil layer transferred from a roll leaf only to said adhesive patterns and not to remaining areas of said substrate;

said one or more first protrusions of said first textured pattern extend to said first height normal to said lateral plane;

said one or more second protrusions of said second pattern extend to said second height normal to said lateral plane;

said one or more reflective layers over said one or more first protrusions of said first textured pattern extend to a third height normal to said lateral plane;

said one or more reflective layers over said one or more second protrusions of said second textured pattern extend to a fourth height normal to said lateral plane;

said fourth height is greater than said third height;

and comprising an image formed over a third area of said front surface which is at least partially not occupied by said one or more reflective layers.

5. The printed substrate according to claim 4 wherein said base is at least partially transparent and has a rear surface opposite to said front surface, and comprising an additional reflective layer formed on said rear surface.

6. The printed substrate according to claim 5 further comprising an opaque background layer on said additional reflective layer on said rear surface.

7. A printed substrate comprising:

a base having a front surface, and extending along a lateral plane;

a first textured pattern formed over a first area of said front surface and having one or more first protrusions extending normally therefrom;

a second textured pattern formed over a second area of said front surface and having one or more second protrusions extending normally therefrom;

one or more reflective layers over said first and second textured patterns, wherein:

said one or more first protrusions of said first textured pattern extend to a first thickness to provide a first height normal to said lateral plane;

said one or more second protrusions of said second pattern extend to a second thickness to provide a second height normal to said lateral plane;

said one or more reflective layers over said one or more first protrusions of said first textured pattern extend to a third height normal to said lateral plane;

said one or more reflective layers over said one or more second protrusions of said second textured pattern extend to a fourth height normal to said lateral plane;

said second thickness is greater than said first thickness;

said fourth height is greater than said third height;

said one or more protrusions of said first textured pattern having a first face surface facing said base, and having a distally opposite second face surface facing away from said base;

said first thickness is the distance between said first and second face surfaces;

said one or more protrusions of said second textured pattern having a third face surface facing said base, and having a distally opposite fourth face surface facing away from said base;

said second thickness is the distance between said third and fourth face surfaces.

8. The printed substrate according to claim 7 wherein in combination:

said second height is greater than said first height;

said third height is less than said second height.

* * * * *